United States Patent
Tsunoda et al.

(10) Patent No.: US 9,378,307 B2
(45) Date of Patent: Jun. 28, 2016

(54) METHOD AND APPARATUS FOR SIMULATING PLASTIC MATERIAL FLOWING THROUGH EXTRUDING CHANNEL

(71) Applicant: SUMITOMO RUBBER INDUSTRIES, LTD., Kobe-shi, Hyogo (JP)

(72) Inventors: Masaya Tsunoda, Kobe (JP); Ryosuke Tanimoto, Kobe (JP)

(73) Assignee: SUMITOMO RUBBER INDUSTRIES, LTD., Kobe-Shi (JP)

( * ) Notice: Subject to any disclaimer, the term of this patent is extended or adjusted under 35 U.S.C. 154(b) by 806 days.

(21) Appl. No.: 13/690,192

(22) Filed: Nov. 30, 2012

(65) Prior Publication Data
US 2013/0238293 A1 Sep. 12, 2013

(30) Foreign Application Priority Data
Mar. 7, 2012 (JP) .................................. 2012-050743

(51) Int. Cl.
G06F 7/60 (2006.01)
G06F 17/10 (2006.01)
G06F 17/50 (2006.01)

(52) U.S. Cl.
CPC ............ *G06F 17/50* (2013.01); *G06F 17/5018* (2013.01)

(58) Field of Classification Search
CPC .............................. G06F 17/50; G06F 17/5018
See application file for complete search history.

(56) References Cited

U.S. PATENT DOCUMENTS

2007/0107506 A1 5/2007 Kishida et al.
2010/0305746 A1 12/2010 Shiraishi

OTHER PUBLICATIONS

Ghoreishy, M. H. R., M. Razavi-Nouri, and G. Naderi. "Finite element analysis of a thermoplastic elastomer melt flow in the metering region of a single screw extruder." Computational materials science 34.4 (2005): 389-396.*
Ha, Y. S., et al. "Finite element analysis of rubber extrusion forming process for automobile weather strip." Journal of materials processing technology 201.1 (2008): 168-173.*
Petera, J., and V. Nassehi. "Finite element modelling of free surface viscoelastic flows with particular application to rubber mixing." International journal for numerical methods in fluids 23.11 (1996): 1117-1132.*

* cited by examiner

*Primary Examiner* — Aniss Chad
(74) *Attorney, Agent, or Firm* — Birch, Stewart, Kolasch & Birch, LLP (57) ABSTRACT

A computerized method for simulating a plastic material flowing through an extruding channel comprises a step of making a flow calculation. The flow calculation includes: a primary calculation based on the plastic material model provided with a viscosity which is constant; a secondary calculation based on the plastic material model which is provided with a viscosity having a shear-velocity dependency or alternatively a temperature dependency, and whose initial values are set to those of the material model calculated in the primary calculation step; and a third calculation based on the material model which is provided with a viscosity having both of the shear-velocity dependency and the temperature dependency, and whose initial values are set to those of the material model calculated in the secondary calculation step.

7 Claims, 7 Drawing Sheets

METHOD AND APPARATUS FOR SIMULATING PLASTIC MATERIAL FLOWING THROUGH EXTRUDING CHANNEL

BACKGROUND OF THE INVENTION

The present invention relates to a computerized method and an apparatus for simulating a plastic material flowing through an extruding channel capable of estimating a physical quantity of the extruded plastic material.

In recent years, in order to estimate various performances of a pneumatic tire, a computerized simulating method becomes widely used. This greatly helps to reduce the period and cost for developing a pneumatic tire.

On the other hand, various tire constructional rubber members are manufactured by extruding unvulcanized rubber compounds. The cross-sectional shape, layered structure and the like of an extruded unvulcanized rubber exert a great influence on tire performances.

However, until now, developments of the extrusion of unvulcanized rubber mainly relies on experiences and intuitions of skilled artisans. Thus, it is important to increase the efficiency of the developments of the configurations of an extrusion die, a pre-former and the like which exert a great influence on the cross-sectional shape, layered structure and the like of the extruded rubber.

SUMMARY OF THE INVENTION

Therefore, the present invention was studied out in order to enable an accurate estimation of an unvulcanized rubber compound extruded form an extruder. Thus, an object of the present invention is to provide a method for simulating a plastic material such as unvulcanized rubber which flows through an extruding channel having a variable cross-sectional area.

According to the present invention, a computerized method for simulating a plastic material flowing through an extruding channel having a variable cross-sectional area and an input port and an output port for the plastic material, comprises a step of defining a material model of the plastic material, a step of generating a channel model which is a finite element model of the extruding channel, a step of defining the material model on a portion of the channel model corresponding to the internal space of the extruding channel, a step of making a flow calculation for a flow of the material model from the input port to the output port, and a step of acquiring a physical quantity of the material model, wherein the flow calculation includes:

a primary calculation in which the flow calculation is made until the flow becomes stable, based on the material model provided with a viscosity which is constant;

a secondary calculation in which, the flow calculation is made until the flow becomes stable, based on the material model, which is provided with a viscosity having a shear-velocity dependency or alternatively a temperature dependency, and whose initial values are set to those of the material model calculated in the primary calculation step; and a third calculation in which the flow calculation is made until the flow becomes stable, based on the material model, which is provided with a viscosity having both of the shear-velocity dependency and the temperature dependency, and whose initial values are set to those of the material model calculated in the secondary calculation step.

According to the present invention, an apparatus for simulating a plastic material flowing through an extruding channel having a variable cross-sectional area and an input port and an output port for the plastic material, comprises means for feeding a material model of the plastic material, means for feeding a channel model which is a finite element model of the extruding channel, means for defining the material model in the channel model, means for making a flow calculation for a flow of the material model from the input port to the output port, and means for acquiring a physical quantity of the material model, wherein the above-mentioned means for making the flow calculation makes the following:

a primary calculation in which the flow calculation is made until the flow becomes stable, based on the material model provided with a viscosity which is constant;

a secondary calculation in which, the flow calculation is made until the flow becomes stable, based on the material model, which is provided with a viscosity having a shear-velocity dependency or alternatively a temperature dependency, and whose initial values are set to those of the material model calculated in the primary calculation step; and a third calculation in which the flow calculation is made until the flow becomes stable, based on the material model, which is provided with a viscosity having both of the shear-velocity dependency and the temperature dependency, and whose initial values are set to those of the material model calculated in the secondary calculation step.

The material model may include a first material model and a second material model having different viscosities, and in the flow calculation, a multiphase flow of the first material model and the second material model is calculated based on a VOF method.

The flow calculation may be made in two steps: a first step in which the flow calculation is made on the first material model only; and a second step which is made after the first material model becomes a stable state, and in which the flow calculation is made on the first material model as well as the second material model gradually supplied from the input port.

The channel model may comprise a first channel model on which the first material model is defined, and a second channel model on which the second material model is defined, and the second channel model joins the first channel model in a downstream side so that the first material model and the second material model flow together to form said multiphase flow.

According to the present invention, therefore, it is possible to quantitatively get a grasp of the conditions and behavior of the plastic material flowing through the extruding channel and extruded therefrom. As a result, developments of extruders, rubber products such as various tires and the like become more efficient.

Further, by the primary, secondary and third calculations, the viscosity to be processed by the computer during the flow calculation becomes gradually complex from non dependency (constant), then one dependency and lastly two dependencies. Therefore, the calculation becomes stable, and the solution becomes easy or quickly converged although there is a high probability that a flow calculation is not converged when a viscosity having both of a shear-velocity dependency and a temperature dependency is defined at the beginning of the flow calculation.

DESCRIPTION OF THE PREFERRED EMBODIMENTS

Embodiments of the present invention will now be described in detail in conjunction with accompanying drawings.

A simulating method as an embodiment of the present invention is to accurately simulate an unvulcanized rubber compound flowing through an extruding channel connected to the nozzle of an extruder (screw) and extruded from an extrusion die. Such simulating method is implemented by a computer system 1. Thus, the computer system 1 constitutes an apparatus for simulating a plastic material flowing in an extruding channel according to the present invention.

Figure 2:
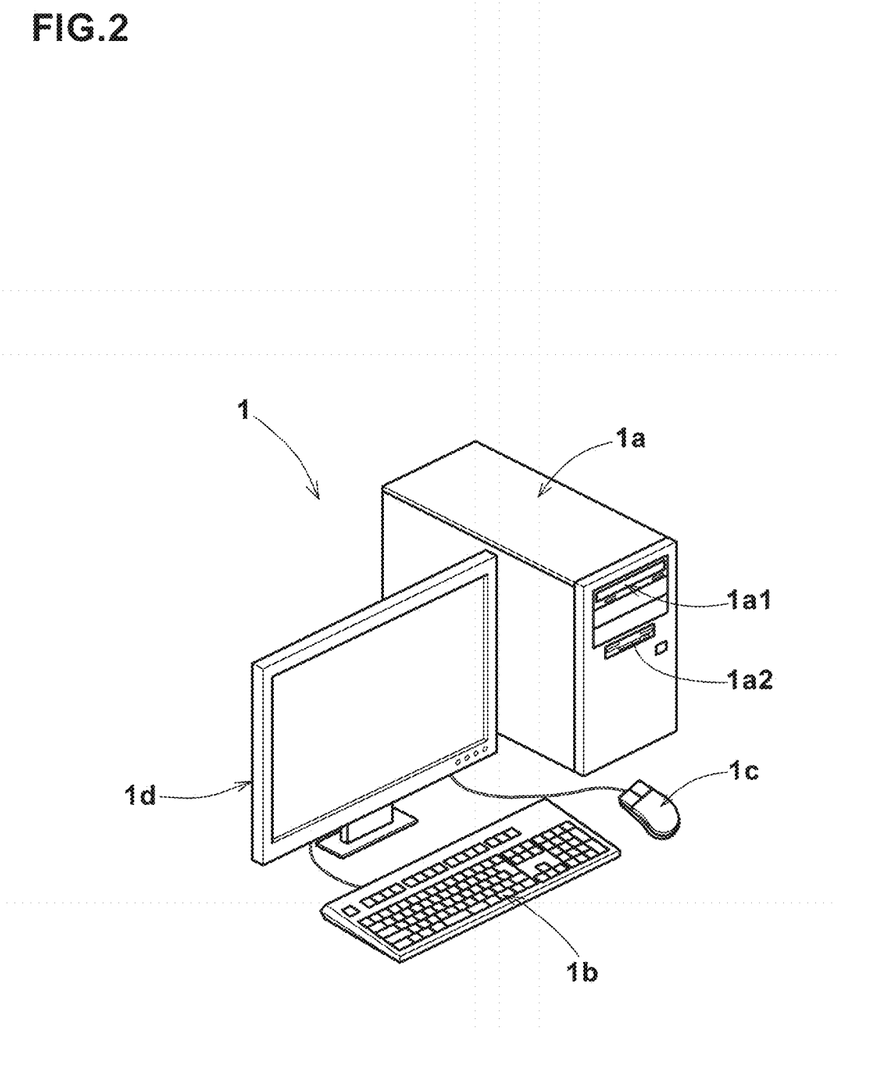
FIG. 2 is a perspective view of a computer system as a simulating apparatus according to the present invention.

As shown in FIG. 2 for example, the computer system 1 comprises a main body 1a, a keyboard 1b, a mouse 1c and a display 1d. The main body 1a comprises an arithmetic processing unit (CPU), memory, storage devices such as magnetic disk, disk drives 1a1 and 1a2 and the like. In the storage device, programs/software for carrying out the simulating method are stored.

Figure 1:
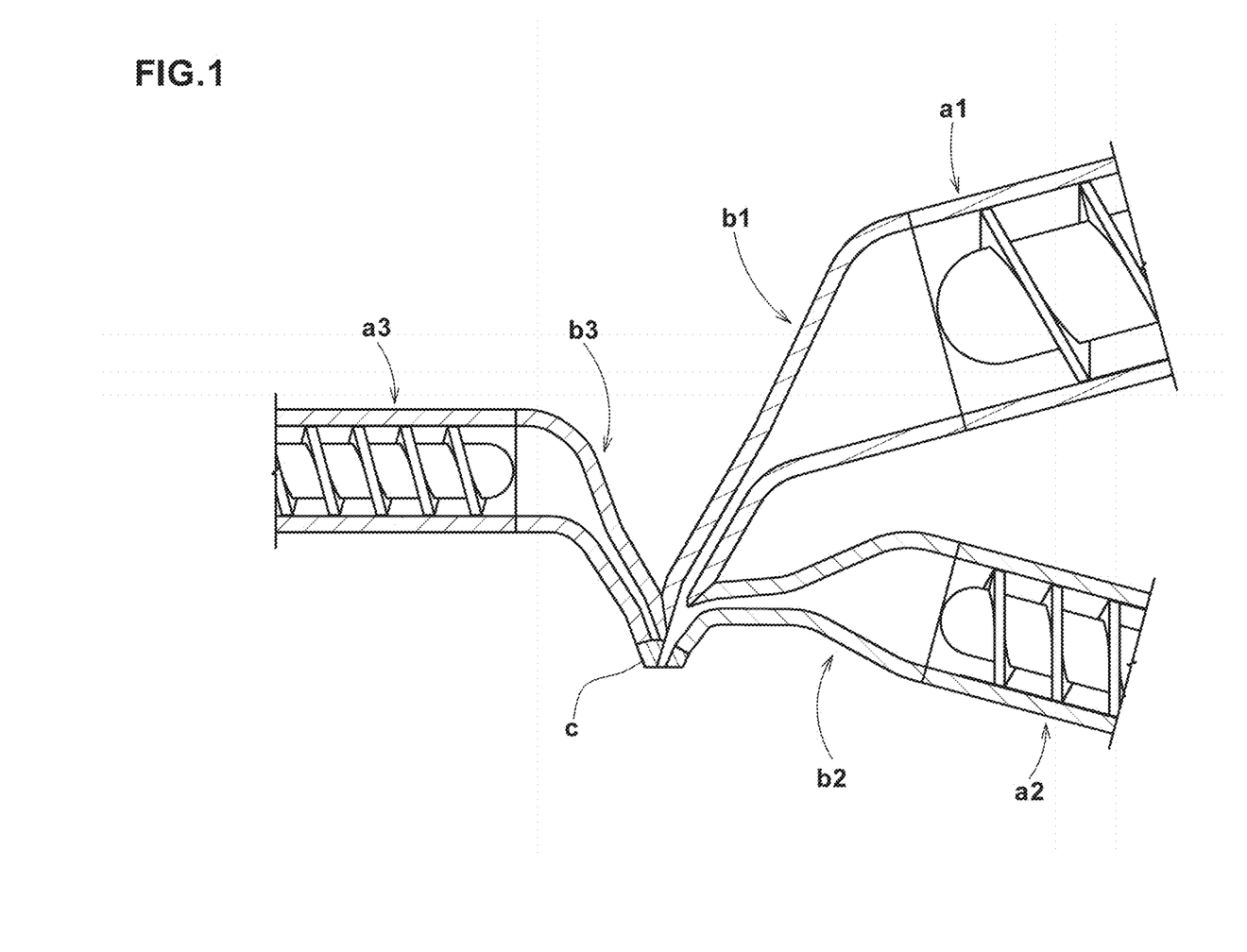
FIG. 1 is a schematic cross sectional view showing a head portion of an extruder having three extruding channels and a single extruding nozzle used in a simulating method according to the present invention.

In FIG. 1, shown is a head portion of a multi-screw type extruder having three extruding channels b1, b2 and b3 and a single extruding nozzle O.

The extruding channels b1, b2 and b3 are respectively connected to the output ports of the three screw extruders a1, a2 and a3. On a downstream side, these three extruding channels b1, b2 and b3 join together into a single extruding channel, and at the downstream end thereof, an extrusion die (c) having the single extruding nozzle O is disposed.

On the downstream side, three kinds of unvulcanized rubber compounds (hereinafter, rubber materials), which are respectively fed to the input ports of the three extruding channels b1, b2 and b3, flow together in laminae or flow into each other depending on the structure of the extrusion die (c), and are extruded.

In this particular case shown in FIG. 1, a raw tread rubber strip for a pneumatic tire is extruded, wherein a cap rubber compound flows in the channel b1, a base rubber compound flows in the channel b2, and a wing rubber compound flows in the channel b3 which is divided into two near the nozzle O.

In this embodiment, the flows of such rubber materials are estimated in order to improve the quantity of the extruded product and to improve the extruder especially the configurations of the extruding channels, extrusion die and the like.

The present invention is premised on a plastic material being in a stable fluidized state (fluid).

As explained, the plastic material in this embodiment is an unvulcanized rubber compound before cross-linked. In this case, a state of the mixture kneaded in good part at around 80 degrees C may be regarded as a stable fluidized state.

Aside from the unvulcanized rubber compounds, the plastic material may be resin materials, elastomers and the like as far as they have flowability.

Figure 3:
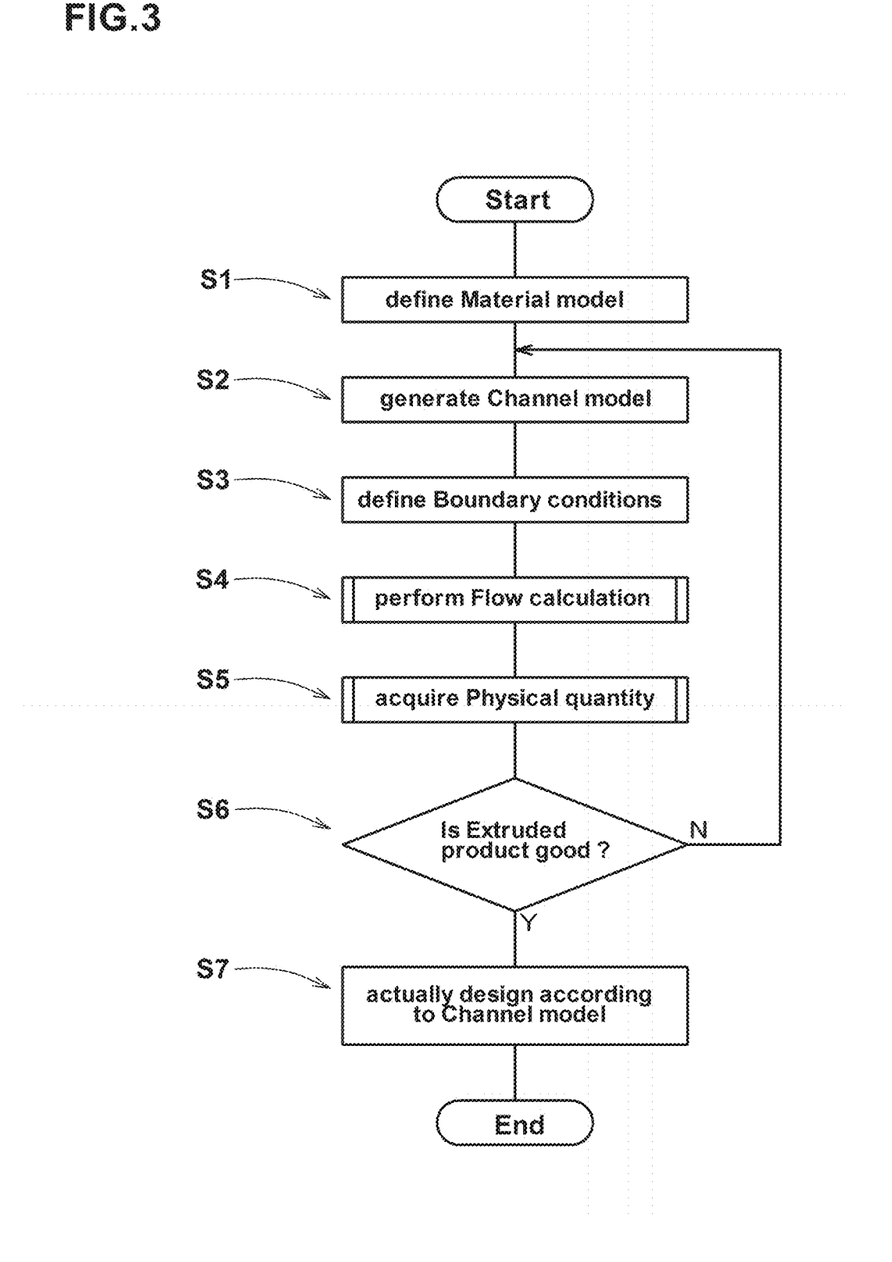
FIG. 3 is a flow chart of a simulating method as an embodiment of the present invention.

FIG. 3 shows a flow chart of a simulating method as an embodiment of the present invention.

Step S1 of Defining Material Model

In this embodiment, first, data for defining a material model of the plastic material (rubber material) flowing in each extruding channel (b1, b2, b3).are entered and stored in the computer system 1.

In this embodiment, data for defining three kinds of material models respectively representing three kinds of rubber materials having different viscosity (shear viscosity) are entered and stored in the computer system 1.

Such data include physical properties of each rubber material, e.g. shear viscosity, specific heat, thermal conductivity, etc.

[Shear Viscosity]

In order to obtain the shear viscosity, firstly, viscoelastic properties (G' and G") of the well kneaded rubber material are measured under plural temperature conditions. Then, according to the Cox-Merz rule, the measured viscoelastic properties are converted into the shear viscosity. The converted values are entered and stored in the computer in advance.

$$\eta = m_Y{}'^{n-1}$$

wherein,

η: shear viscosity, m: a coefficient as a function of absolute temperature,

Y': shear velocity, and n: a coefficient.

Thus, the shear viscosity η has a shear-velocity dependency and a temperature dependency.

In this embodiment, the three kinds of the material models are provided with different shear viscosities. Preferably, an upper limit and a lower limit are defined for each shear viscosity.

[Specific Heat]

The specific heat of the analysis object (rubber material) can be obtained by the thermally-insulated continuous-heating method (@25 degrees C.). The obtained values are entered and stored in the computer in advance.

In this embodiment, the three kinds of the rubber materials are provided with an identical specific heat value.

[Thermal Conductivity]

The thermal conductivity of the analysis object (rubber material) can be obtained by the hot wire method (@25 degrees C.). The obtained values are entered and stored in the computer in advance.

Step S2 of Generating Channel Model

Figure 5:
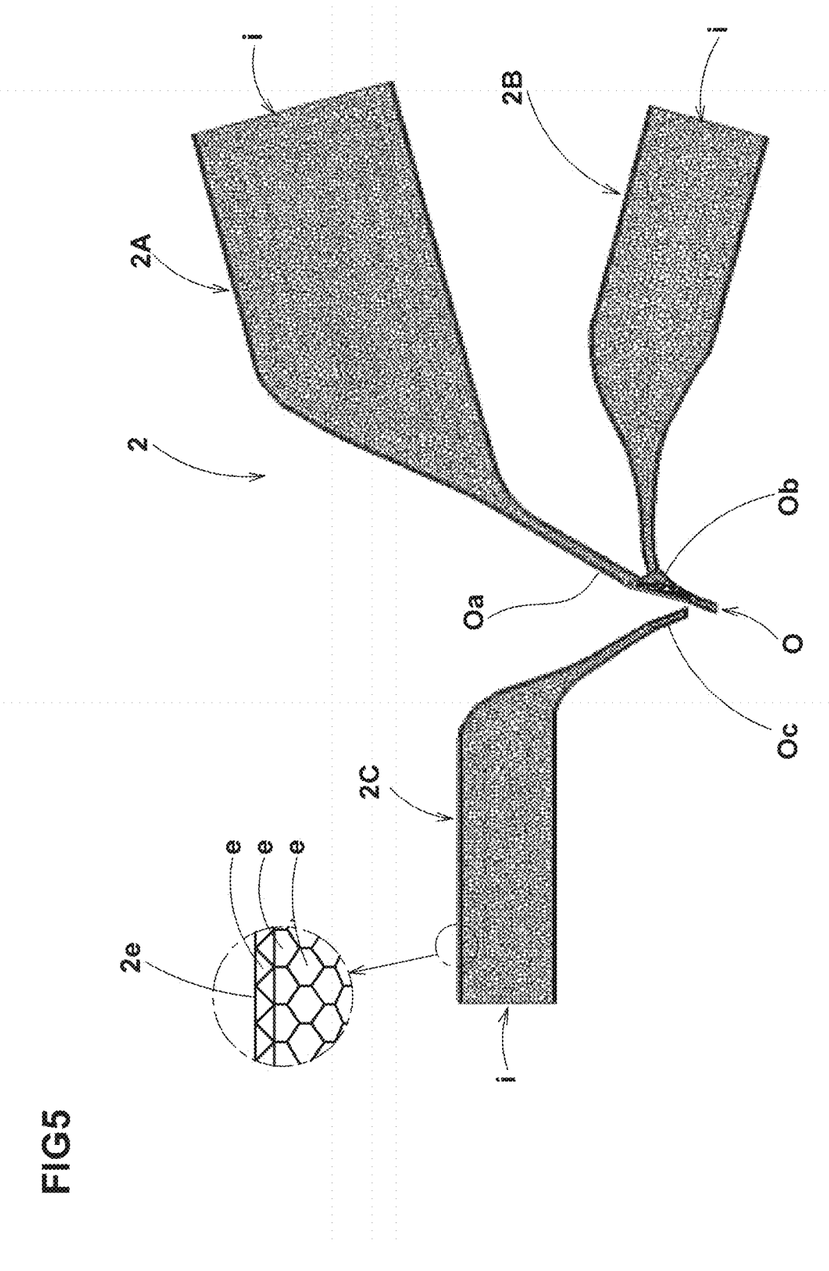
FIG. 5 is a cross sectional view for explaining the meshing of the walls and internal spaces of the extruding channels.

Next, the computer system 1 generates a channel model 2 which is a finite elements model of the wall and the internal 3D space of each extruding channel as shown in FIG. 5.

The internal 3D space is divided (discretized) into the 3D elements (e) such as tetrahedral elements, hexahedral elements and polyhedral elements, as Euler elements (e)

Each channel model 2 has an input port (i) at its one end to which the material model is fed and an output port (o) at the other end from which the material model is pushed out.

Figure 4A:
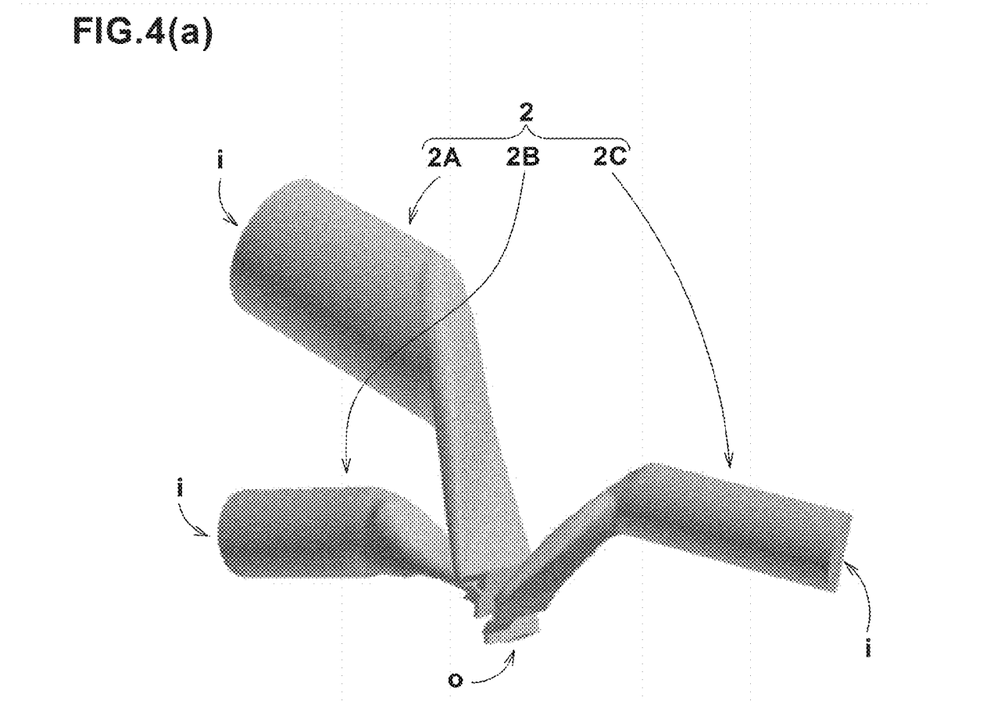
FIG. 4(a) is a perspective view showing a finite element model as a full model of the three extruding channels.
Figure 4B:
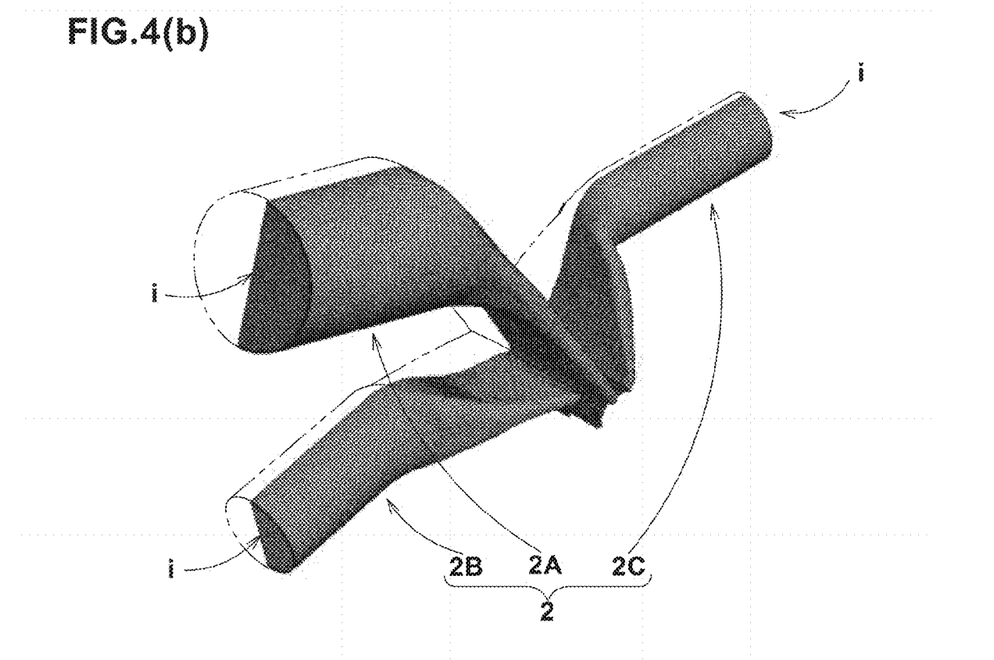
FIG. 4(b) is a perspective view showing a finite element model as a half model of the three extruding channels.

In this embodiment, as shown in FIGS. 4 and 5, there are three channel models 2 which are a first channel model 2A of the extruding channel (b1), a second channel model 2B of the extruding channel (b2), and a third channel model 2C of the extruding channel (b3).

The three channel models respectively have the independent input ports (i) and the independent output ports Oa, Ob and Oc.

The material models flowing or passing through the respective channel models 2A, 2B and 2C and output ports Oa, Ob and Oc are extruded from the single nozzle O.

The cross-sectional area of each of the channel models 2A, 2B and 2C is varied along the flow direction.

In this embodiment, the cross-sectional area is gradually decreased from the upstream side to the downstream side. Usually, each channel model is generated to represent the entirety of the extruding channel as shown in FIG. 4(a). However, it is also possible that only one half of each model (2A, 2B, 2C) is generated as shown in FIG. 4(b) in order to reduce the computational time. Of course, the channel model/ extruding channel is not limited to such configuration.

using the channel model 2, physical quantities of the rubber material such as pressure, temperature and/or velocity are computed for each element.

Step S3 of Defining Boundary Conditions

Next, boundary conditions are defined.

In this embodiment, the boundary conditions are the flow velocity and temperature of each material model at the input port (i) of the channel model and the pressure at the nozzle O (usually zero).

The flow velocity and temperature of each material model can be determined, for example, by actually measuring at the extruding channel as the analysis object.

The wall-surface 2e of each channel model 2 (2A, 2B, 2C) is defined as having a temperature (in this embodiment, a constant temperature).

Further, on the wall-surface 2e of each channel model 2, one of the following flow velocity boundary conditions:
(a) surface non-slip condition,
(b) wall-surface slip condition,
is defined according to the purpose of the simulation, required accuracy and the like.

In the case of the wall-surface non-slip condition, the flow velocity of the material model at the wall-surface of the channel model 2 is always zero.

In the case of the wall-surface slip condition, the flow velocity of the material model at the surface of the channel model 2 may have non-zero values as well as zero value.

The inventor measured the shearing force occurring at the wall-surface of the extruding channel though which a rubber material flows and found that the effect of the slip on the distribution of plural kinds of rubber materials having different compositions is very minor. Therefore, in this embodiment, the wall-surface non-slip condition is defined on each channel model 2.

Furthermore, the boundary conditions may include the time intervals or steps of the flow calculation (simulation), the number of iterations in the internal processing, the maximum period of computation and the like.
These conditions can be defined arbitrarily according to the objective of the simulation and the like.

Step S4 of Performing Flow Calculation

Next, the computer system 1 defines each material model on the internal 3D space in the corresponding channel model 2.

Then, according to the boundary conditions, the computer system 1 performs a flow calculation to flow the material model from the input port (i) to the nozzle (o).

By the flow calculation, at the position of each element (e) of the internal 3D space portion of the channel model 2, velocity components in three coordinate axes directions (x, y, z) which specify the motional state of the material model, and the temperature T and the pressure p which specify the internal state of the material model are obtained. Thus, unknowns to be solved are these five physical quantities.

The flow calculation in this embodiment is performed by the use of the Navier-Stoks equation for an incompressibility flow, setting the density of each material model at a constant value.

In this embodiment, each material model is treated as fluid throughout the possible temperature range. Therefore, a Navier-Stoks equation, an equation for conservation of mass and an energy equation have to be solved as simultaneous equations of fluid.

In this embodiment, in order to deal with a multiphase flow of plural kinds of the material models having the different shear viscosities, occurring near the nozzle (O), the VOF (Volume of Fluid) method, which is used to calculate the flow of a free interface, is employed. The VOF method is not to directly calculate the motion of the interface between two kinds of fluid (material models) different in the shear viscosity. In the VOF method, a free interface is expressed by defining a volume fraction which corresponds to a filling rate of the material model within the volume of each element.

The government equations are as follows.
[Motion Equation]

In the this embodiment, a three-phase flow in which three kinds of the material models flow together is treated as a single phase flow.

In this case, the motion equation to be solved is the following equation in the three coordinate axes directions x, y and z. This becomes possible as a result of that the three phases are averaged by the VOF method and treated as a single phase.

$$\nabla \cdot (\rho \vec{u}\vec{u}) = -\nabla p + \nabla \cdot [\mu(\nabla \vec{u} + \nabla \vec{u}^T)] + \rho \vec{g} + \vec{F}$$

wherein
u: velocity of the multiphase flow model,
p: pressure of multiphase flow model,
ρ: density of the multiphase flow model,
g: gravitational acceleration,
T: absolute temperature of the multiphase flow model,
F: external force.

The values of the density ρ and the shear viscosity η of the multiphase flow model used herein are weighted by the occupied volumes of the respective phases, namely first, second and third material models and then averaged as follows.

$$\rho = \Sigma \alpha_q \rho_q$$

$$\eta = \Sigma \alpha_q \eta_q$$

wherein
$\alpha_q$: volume fraction of each phase in each element,
$\rho_q$ density of each phase in each element,
$\eta_q$: shear viscosity of each phase in each element.
[Equation for Conservation of Mass]

As to the equation for conservation of mass (equation of continuity) and pressure equation, it is enough to solve only one set of equations in the three coordinate axes directions. Therefore, according to the simulating method in this embodiment, the computer can calculate the flow field as a shingle phase despite the multiphase. In other words, to be solved is the flow in which the materials properties are varied with position (volume fraction).

The position of each phase can be estimated according to the distribution of the volume fraction obtained as the result of the calculation.

[Energy Equation]

The temperature of the material model can be obtained by the following energy equation.

$$\frac{\partial}{\partial t}(\rho E) + \nabla \cdot (\vec{u}(\rho E + p)) = \nabla \cdot (k_{eff} \nabla T) + S_h$$

$$E = \frac{\sum_{q=1}^{n} \alpha_q \rho_q E_q}{\sum_{q=1}^{n} \alpha_q \rho_q}$$

wherein
E: enthalpy,
k: thermal conductivity,
s: source term.

[Transport Equation of Volume Fraction]

The distribution of the volume fraction determines the position of the interface between the phases (or the material models). The volume fraction $\alpha q$ can be obtained by accurately solving the following expression.

$$\frac{\partial}{\partial t}(\alpha_q \rho_q) + \nabla \cdot (\alpha_q \rho_q \vec{u}_q) = S_{\alpha q}$$

If the volume fraction $\alpha q=0$ in an arbitrary element (e), this means that the q phase does not exist in this element (e).

If the volume fraction $\alpha q=1$, this means that the entire volume of the element (e) is filled with the q phase.

If $0<\alpha q<1$, this means that the element (e) is filled with the q phase and other phase or phases, that is, the element is multiphase having interface(s).

This equation can be solved by modified-HRIC (Implicit) of which detailed description is given by "ANSYS Fluent User's Manual, 26.2.9 Modified HRIC Scheme."

In this embodiment, each of the above-mentioned equations is solved by the pressure-based partitioned method.

For the coupling of the pressure equation and the motion equation, the SIMPLE (Semi-Implicit Method for Pressure-Linked Equations) algorithm is preferably used.

Figure 6:
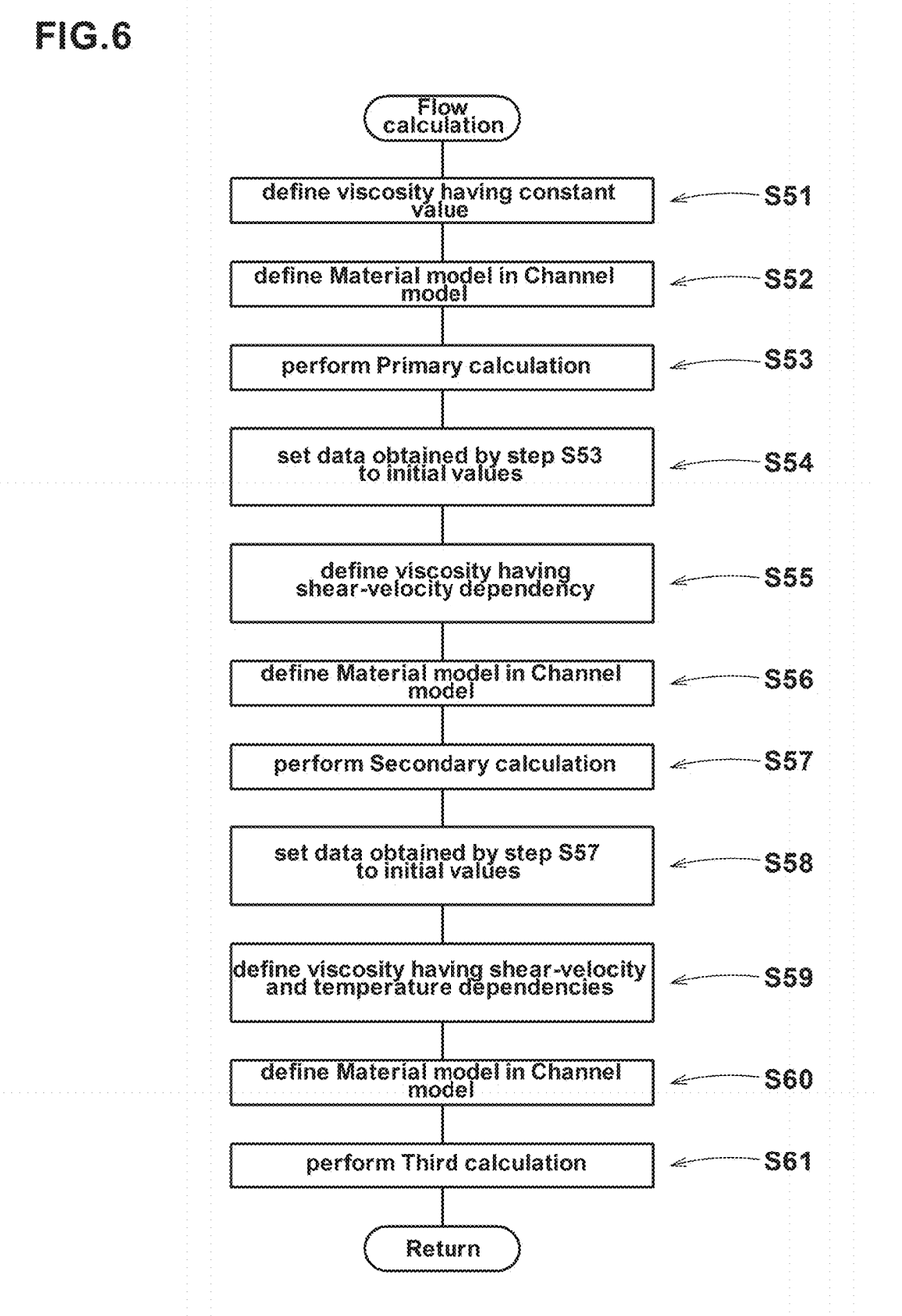
FIG. 6 is a flow chart of an example of the flow calculation.

FIG. 6 shows a flowchart of an example of the flow calculation performed by the computer system 1.

In the flow calculation, it is possible to define, from the start, the shear viscosity of each material model to have a shear-velocity dependency and a temperature dependency. In this case, however, there is a possibility that the calculation does not converge depending on conditions.

Step S51

In this embodiment, therefore, at first, the shear viscosity of each material model is transiently changed as being independent of the shear velocity and the temperature.

In the former step S1, the shear viscosity η is explained as being defined by the following expression, taking the shear-velocity dependency and the temperature dependency into consideration.

$$\eta = m \gamma^{n-1}$$

In the step S51 in this embodiment, therefore, the shear viscosity η is transiently set at a constant value which is obtained by experimentally measuring the shear viscosity at a typical temperature (for example 100 degrees C.) and a typical shear velocity (for example 10(1/s)).

Step S52

Each material model provided with the constant shear viscosity is defined on the internal space portion of the corresponding channel model 2.

Step S53

Then, the computer system 1 performs a primary calculation.

specifically, using the channel models 2 including the first, second and third material models on which the physical properties including the constant shear viscosities are defined, the computer system 1 calculates the flow of each material model until the calculated flow becomes stable.

Figure 7:
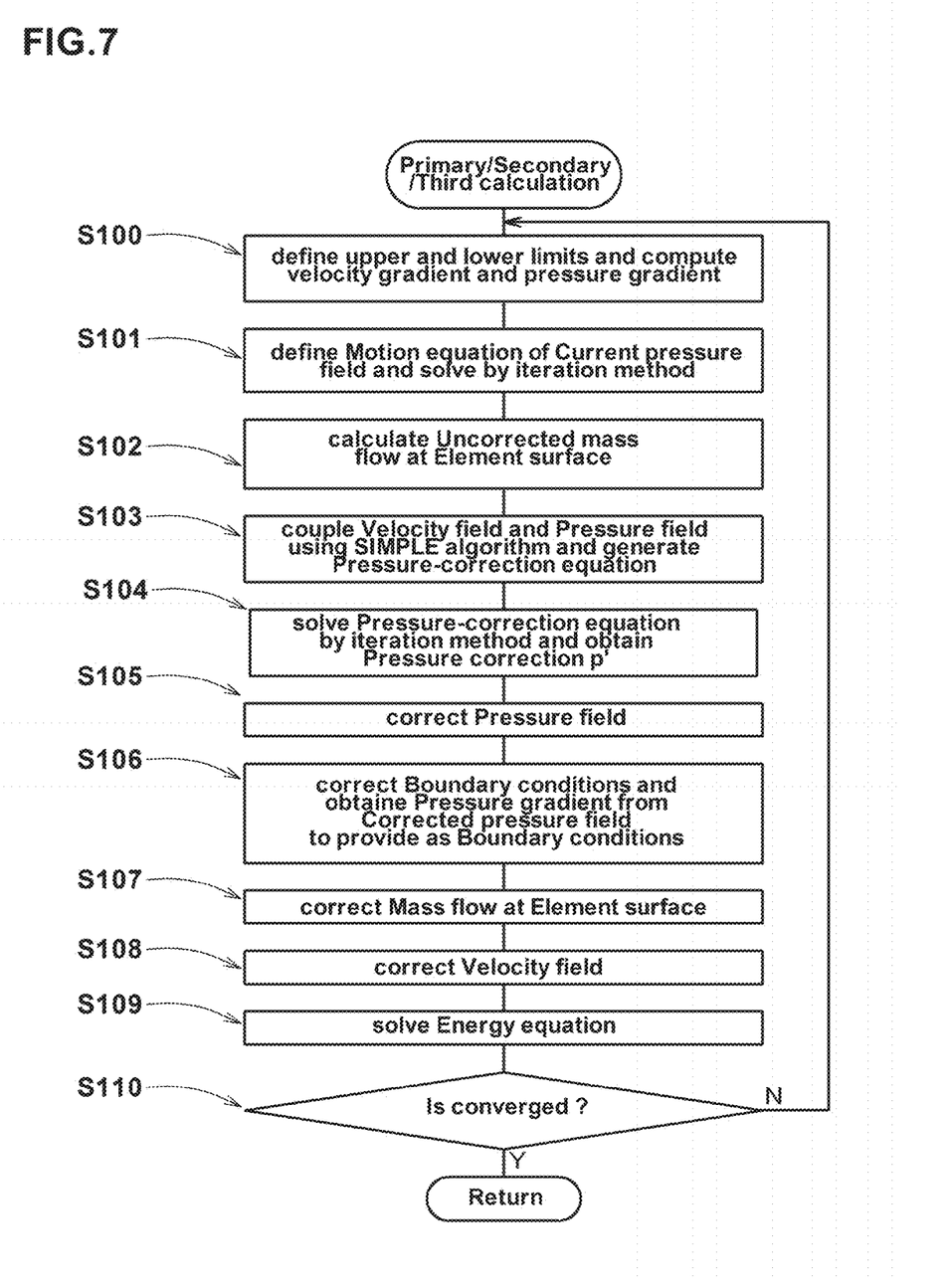
FIG. 7 is a flow chart of an example of the fist/second/third calculation.

FIG. 7 shows a flow chart of an example of the primary calculation.

Step S100

In this example, firstly, upper and lower limits for the pressure gradient and the velocity of the material model are set, and the velocity gradient and the pressure gradient are computed.

Step S101

Next, the motion equation is defined by discretization of the current pressure field, and the motion equation is solved by a method of iteration. That is, the velocity of the material model (or multiphase) in three coordinate axes directions is computed. As to the method of iteration, the Gauss-seidel method can be used.

Step S102

Next, in order to examine whether or not the above-mentioned velocity satisfies the equation for conservation of mass, uncorrected mass flow of each material model at the surfaces of the elements of the channel model 2 is calculated first. Here, the "uncorrected mass flow" is a mass flow temporarily used at the beginning of the loop of the SIMPLE algorithm. Such mass flow may have a large error, therefore, it is called "uncorrected mass flow".

The mass flow is necessary for determining whether the law of conservation of mass is satisfied or not.

Step S103

Next, using the SIMPLE algorithm, the velocity field and the pressure field are coupled, and the following pressure-correction equation for correcting the pressure field is generated.

$$\nabla[k \nabla \phi] = src$$

Step S104

Next, by the method of iteration for example AMG solver, CG or Bi-CG and the like, the pressure-correction equation is solved, and a pressure correction amount p' is computed.

Step S105

Next, based on the obtained solution, the pressure field is corrected by the following expression:

$$p^{n+1} = p^n + \omega p'$$

wherein
p: pressure,
n: current number of time step,
ω: relaxation coefficient which is 0.3 in this example.

Step S106

Next, the boundary conditions of the wall-surface are corrected (or updated). Specifically, from the corrected pressure field, the pressure gradient is obtained.

The obtained pressure gradient is provided as the boundary conditions of the wall-surface.

Step S107

Next, the mass flow of each material model at the surfaces of the elements is corrected by the following expression:

$$mf^{n+1} = mf^* + m'f$$

wherein,
$mf^{n+1}$: corrected mass flow at the surfaces of the elements,
$mf^*$: uncorrected mass flow at the surfaces of the elements,
m'f: correcting value of mass flow.

Step S108

Next, the velocity field is corrected by the following expression:

$$v^{n+1} = v^* - (\nabla \nabla p'/\alpha pV)$$

wherein
$\nabla p'$: gradient of pressure correction amount,
$\alpha pV$: diagonal component of velocity in motion equation.

Step S109

Next, by solving the energy equation, the temperature of each material model is calculated.

If this calculation is judged as being not converged (N in step S110), the computer again performs the step S100 and the subsequent steps.

The convergence can be judged, based on whether the total number of the corrected mass flows is within a predetermined error range or not.

If this calculation is judged as being converged ("Y" in step S110), the flow returns to the flow chart shown in FIG. 6. This state is considered as a stable state of the flow of the material model.

Step S54

Next, with the computer system 1, the pressure and velocity (triaxial components) of each element of each channel model 2 obtained in the primary calculation step S53 are set to the initial values of the velocity field at the beginning of a secondary calculation.

Step S55

Further, the computer system 1 defines the shear viscosity of each material model as having a shear-velocity dependency or alternatively a temperature dependency.

In the this embodiment, the shear-velocity dependency is given to the shear viscosity. The temperature dependency is not given to the shear viscosity.

In the former step S1, as explained, the shear viscosity η is defined, taking the shear-velocity dependency and the temperature dependency into consideration.

In this step S55, however, the viscosity is transiently changed as having the shear-velocity dependency only.

Step S56

Next, with the computer system 1, the first, second and third material models on which the viscosities having only the shear-velocity dependency are defined on the internal space portions of the respective channel models 2.

Step S57 (Secondary Calculation)

Then, the computer system 1 performs the secondary calculation.

specifically, using the channel models 2 including the material models, the computer system 1 calculates the flow of each material model until the calculated flow becomes stable.

The secondary calculation is performed according to the procedure similar to the primary calculation shown in FIG. 7.

In each channel model 2, the shear velocity is usually varied with element. Therefore, in the secondary calculation, the shear viscosity is computed based on the shear velocities of the elements.

The shear viscosity having uneven distribution has influence upon the velocity field of the channel model and a pressure variation is caused.

In the secondary calculation, therefore, the convergence calculation is made until the distribution is balanced.

Step S58

Next, with the computer system 1, the pressure and velocity (triaxial components) of each element of each channel model 2 obtained in the secondary calculation step S57 are set to the initial values of the velocity field at the beginning of a third calculation.

Step S59

Next, the computer system 1 adds the temperature dependency to the shear viscosity of each material model.

Step S61 (Third Calculation)

Using the channel models including the material models provided with physical properties including the shear viscosities each having both of the shear-velocity dependency and the temperature dependency, the computer system 1 calculates the flow of each material model until the calculated flow becomes stable.

The third calculation is performed according to the procedure similar to the primary calculation shown in FIG. 7.

Step S5 of Acquiring Physical Quantity

When the flow calculation is finished, the computer system 1 acquires desired physical quantities from the material models whose flow is in a stable state.

As to the desired physical quantities, it is preferable to acquire physical quantities at the position of the nozzle (o) in addition to the velocity, pressure and temperature of the material models obtained in the flow calculation.

Step S6

Next, based on the physical quantities of the product (material model) extruded from the nozzle (o), it is judged whether the extruded product is good or not.

The criteria of the judgment are, for example, (a) the flow velocity distribution becomes uniform at the extruding nozzle, (b) the rubber materials having different shear viscosities are distributed in the extruded product as desired, and (c) the temperature distribution in the flow becomes uniform (there is no local hot area).

Step S7

When the extruded product is good, according to the three-dimensional configuration of the channel model 2, the extruding channel or extruder is actually designed.

When the extruded product is not good ("N" in the step S6), the configuration of the extruding channel is modified and the channel model 2 thereof is generated (step S2), and then the step S3 and the subsequent steps are made again.

Therefore, in the simulating method in this embodiment, it is possible to quantitatively get a grasp of a plastic material in a fluidized state such as unvulcanized rubber and resin material before cross-linked at the time of being extruded or injection molding, in order to check and compare the quality. Therefore, by changing the configuration of the channel according to the results, it is possible to design an optimum channel which is for example capable of improving the flow velocity of the plastic material or hard to generate heat. Accordingly, it is also possible to improve a product such as tire formed of the plastic material.

In the above-described embodiment, the shear-velocity dependency is given to the shear viscosity firstly, and then the temperature dependency is additionally given thereto. However, it is also possible that the temperature dependency is given firstly, and then the shear-velocity dependency is additionally given to the shear viscosity. In this case too, the same results can be obtained.

In the above-described embodiment, three kinds of plastic materials having different viscosities are simulated. However, it is of course possible to simulate one kind of a plastic material, and two or four or more kinds of plastic materials having different viscosities.

Taking the above-mentioned extruding channels b1, b2 and b3 as a whole, these can be considered as one extruding channel having three input ports (i) and one output port (nozzle O). Thus, an extruding channel may have plural input ports and/or plural output ports. In the following claims, the term "extruding channel" is used in this sense.

The invention claimed is:

1. A computerized method for simulating a plastic material having a viscosity having a shear-velocity dependency and a temperature dependency and flowing through an extruding channel having a variable cross-sectional area and an input port and an output port for the plastic material, comprising
defining a material model of the plastic material,
generating a channel model which is a finite element model of the extruding channel,
defining the material model in a portion of the channel model corresponding to the internal space of the extruding channel,
making a flow calculation for a flow of the material model from the input port to the output port,
wherein said step of making the flow calculation includes
setting a constant viscosity to the material model to define a primary material model, and making a primary calculation in which the flow calculation for the primary material model is made until the flow of the primarily material model becomes stable to obtain calculated values on the primarily material model,
setting, as initial values, the calculated values obtained in the primary calculation together with the viscosity as having a shear-velocity dependency or alternatively a temperature dependency to the material model to define a secondary material model, and making a secondary calculation in which, the flow calculation for the secondary material model is made until the flow of the secondary material model becomes stable to obtain calculated values on the secondary material model, and
setting, as initial values, the calculated values obtained in the secondary calculation together with the viscosity as having both of the shear-velocity dependency and the temperature dependency to the material model to form a third material model, and making a third calculation in which the flow calculation for the third material model is made until the flow for the third material model becomes stable,
acquiring, from the stably-flowing third material model, physical quantities of the plastic material, wherein the physical quantities include the velocity, pressure and temperature, and
judging whether the plastic material flowing out from the extruding channel is good or not based on the acquired physical quantities,
wherein when judged as not good, a configuration of the extruding channel is modified, and the step of generating a channel model and the subsequent steps are again performed, and
when judged as good, a three-dimensional configuration of the channel model is used to actually design the extruding channel.

2. The method according to claim 1, wherein
the material model includes a first material model and a second material model having different viscosities, and
in the flow calculation, a multiphase flow of the first material model and the second material model is calculated based on a volume of fluid (VOF) method.

3. The method according to claim 2, wherein
the flow calculation is made in two steps: a first step in which the flow calculation is made on the first material model only; and a second step which is made after the first material model becomes a stable state, and in which the flow calculation is made on the first material model as well as the second material model gradually supplied from the input port.

4. The method according to claim 3, wherein
the channel model comprises a first channel model on which the first material model is defined, and a second channel model on which the second material model is defined, and
the second channel model joins the first channel model in a downstream side so that the first material model and the second material model flow together to form said multiphase flow.

5. The method according to claim 2, wherein
the channel model comprises a first channel model on which the first material model is defined, and a second channel model on which the second material model is defined, and
the second channel model joins the first channel model in a downstream side so that the first material model and the second material model flow together to form said multiphase flow.

6. The method according to claim 2, wherein
in the step of judging whether the plastic material flowing out from the extruding channel is good or not, the criteria of the judgment are (a) the flow velocity distribution is uniform at the output port, (b) the material models having the different viscosities are distributed at the output port as desired, and (c) the temperature distribution in the flow becomes uniform, and if at least one of the criteria is not satisfied, the plastic material flowing out from the extruding channel is judged as being not good.

7. The method according to claim 1, wherein
the material model includes a first material model and a second material model having different viscosities,
the channel model comprises a first channel model in which the first material model is defined, and a second channel model in which the second material model is defined,
wherein the second channel model joins the first channel model in a downstream side so that the first material model and the second material model flow together to form a multiphase flow, and
in the flow calculation, the multiphase flow of the first material model and the second material model is calculated based on a volume of fluid (VOF) method.

* * * * *